(12) United States Patent
Heiland

(10) Patent No.: US 8,751,050 B2
(45) Date of Patent: Jun. 10, 2014

(54) COMBINED MOTION CONTROL SYSTEM

(75) Inventor: Peter Heiland, Raunheim (DE)

(73) Assignee: Integrated Dynamics Engineering GmbH (DE)

(*) Notice: Subject to any disclaimer, the term of this patent is extended or adjusted under 35 U.S.C. 154(b) by 1433 days.

(21) Appl. No.: 11/927,244

(22) Filed: Oct. 29, 2007

(65) Prior Publication Data

US 2008/0114473 A1    May 15, 2008

(30) Foreign Application Priority Data

Nov. 8, 2006   (EP) .................................. 06023173

(51) Int. Cl.
| | | |
|---|---|---|
| G05D 23/00 | (2006.01) | |
| G05B 13/02 | (2006.01) | |
| G06F 19/00 | (2011.01) | |
| G06F 7/00 | (2006.01) | |
| F16M 13/00 | (2006.01) | |
| G21K 5/10 | (2006.01) | |

(52) U.S. Cl.
USPC ............. 700/280; 700/44; 700/121; 700/213; 248/550; 248/562; 248/636; 250/442.11

(58) Field of Classification Search
USPC ............ 700/44, 121, 213, 280; 248/550, 562, 248/636, 638; 250/442.11
See application file for complete search history.

(56) References Cited

U.S. PATENT DOCUMENTS

| | | | | | |
|---|---|---|---|---|---|
| 5,163,049 | A | * | 11/1992 | Smith et al. .................... | 370/463 |
| 5,187,519 | A | * | 2/1993 | Takabayashi et al. .......... | 355/53 |
| 5,281,978 | A | * | 1/1994 | Kojima et al. ................ | 347/257 |
| 5,414,633 | A | * | 5/1995 | Chang ........................... | 700/190 |
| 5,961,899 | A | * | 10/1999 | Rossetti et al. ............... | 264/40.1 |
| 6,170,622 | B1 | * | 1/2001 | Wakui et al. ................... | 188/378 |
| 6,512,571 | B2 | * | 1/2003 | Hara .............................. | 355/53 |
| 6,518,721 | B2 | * | 2/2003 | Mayama ....................... | 318/632 |
| 6,538,719 | B1 | * | 3/2003 | Takahashi et al. .............. | 355/53 |

(Continued)

FOREIGN PATENT DOCUMENTS

| | | | |
|---|---|---|---|
| EP | 1 126 323 A2 | 8/2001 | |
| JP | 5335205 A | 12/1993 | |
| JP | 2003071767 A | * | 3/2003 |
| JP | 2004-518204 A | 6/2004 | |

OTHER PUBLICATIONS

"Japanese Office Action for Japanese International Application No. 2007-290433", Dated: Nov. 17, 2010, Publisher: Japanese Patent Office, Published in: JP.

*Primary Examiner* — Albert DeCady
*Assistant Examiner* — Darrin Dunn
(74) *Attorney, Agent, or Firm* — Kaplan Breyer Schwarz & Ottesen, LLP

(57) ABSTRACT

An examination and processing machine, in particular a lithography appliance, for use in the semiconductor industry, comprising a machine frame (1), an examination or processing device (5) for a work piece (4), a carriage (3) which is mounted on the machine frame (1) and can hold the work piece (4), a handling device (6) for positioning the work piece (4) on the carriage (3) and for removing it from the carriage (3), a series of oscillation isolators (2) for low-oscillation mounting of the machine frame (1), and individual control devices (30, 40, 20) for controlling the carriage (3), the handling device (6) and the oscillation isolators (2). These control devices (20, 30, 40) are subordinate to an overall control device (50), which acts as a host system, via a real-time bus (60).

9 Claims, 3 Drawing Sheets

(56) References Cited

U.S. PATENT DOCUMENTS

| | | | |
|---|---|---|---|
| 6,714,842 B1* | 3/2004 | Ito | 700/302 |
| 6,758,313 B2* | 7/2004 | Binnard | 188/378 |
| 6,961,113 B1* | 11/2005 | Hayashi et al. | 355/30 |
| 6,999,162 B1* | 2/2006 | Takahashi | 355/75 |
| 7,181,294 B2* | 2/2007 | Nihei et al. | 700/30 |
| 7,275,627 B1* | 10/2007 | Mayama | 188/378 |
| 7,376,480 B2* | 5/2008 | Hagen et al. | 700/118 |
| 7,461,728 B2* | 12/2008 | Huston et al. | 188/378 |
| 7,686,144 B2* | 3/2010 | Shibayama et al. | 188/378 |
| 7,701,111 B2* | 4/2010 | Pletner et al. | 310/311 |
| 2001/0033146 A1* | 10/2001 | Kato et al. | 318/568.22 |
| 2002/0050572 A1* | 5/2002 | Nagahashi et al. | 250/492.1 |
| 2003/0057346 A1* | 3/2003 | Wakui | 248/550 |
| 2003/0097205 A1* | 5/2003 | Yuan et al. | 700/301 |
| 2003/0197845 A1* | 10/2003 | Morisada | 355/53 |
| 2005/0045821 A1 | 3/2005 | Noji et al. | |
| 2005/0217956 A1* | 10/2005 | Morisada | 188/378 |
| 2006/0206237 A1* | 9/2006 | Morisada | 700/280 |
| 2007/0068756 A1* | 3/2007 | Huston et al. | 188/378 |
| 2007/0156253 A1* | 7/2007 | De Silvio | 700/6 |
| 2007/0252966 A1* | 11/2007 | Shirata | 355/67 |
| 2008/0088833 A1* | 4/2008 | Yokota et al. | 356/237.5 |

* cited by examiner

COMBINED MOTION CONTROL SYSTEM

FIELD OF THE INVENTION

The invention relates to an examination and processing machine, and in particular to a lithography appliance. A machine such as this comprises a machine frame, an examination or processing device for a work piece, a carriage which is mounted on the machine frame and can hold the work piece, a handling device for positioning the work piece on the carriage and for removing it from the carriage, a series of oscillation isolators for low-oscillation mounting of the machine frame, and individual control devices for controlling the carriage, the handling device and the oscillation isolators.

BACKGROUND TO THE INVENTION

A machine such as this is described in DE 698 29 614 T2=EP 0 900 412 B1 (inventor: Erik R. Loopstra et al.) This is a lithography appliance and comprises a frame on which an arm is located, with a radiation source and an optical system (=focusing unit). Furthermore, the machine has a positioning apparatus on which moveable substrate holders are located for the work piece to be processed. Oscillations that occur interfere with the operation of lithography appliances such as these. Oscillation isolation systems are used in order to minimize the influence of oscillations such as these on the machine.

One such oscillation isolation system is disclosed in EP 0 927 380 (Inventors: Erik R. Loopstra and Peter Heiland), and contains air bearings which act vertically and horizontally.

Oscillation isolation systems such as these may be in the form of passive and active systems. In passive oscillation isolation systems, the air bearings react only when oscillations occur, for example of the ground, in order to decouple the machine on oscillation-isolated bearings from the undesirable oscillations. Control systems are additionally used for active oscillation isolation systems. These use sensors to measure the oscillation state of the machine, in order then to pass signals, which counteract the oscillations that have occurred, via actuators to the oscillation isolators. Active oscillation isolation systems such as these make it possible to damp the undesirable oscillations of the machine to be isolated more quickly than is the case when using passive systems.

Appropriate control systems are also used for other moving parts of the overall system, in particular for the robot arm. A plurality of mutually separate control systems are therefore used for an examination or processing machine.

Rough coordination between the individual control systems is achieved by the use of additional host systems, comprising PCs and workstations. In systems such as these, the individual control systems are responsible for controlling the sensor system/actuator system of the respectively associated subsystem in real time, and for carrying out the movement tasks, for example for wafer transportation. The task of the host systems is to determine the times for these movement tasks, and to identify fault states.

One such host system is described, for example, in Korean patent abstracts, publication number 102000041128A, "Wafer Loading Apparatus". This apparatus has a main control device and a robot control device. The robot control device controls the movements of the robot in all three spatial directions, and signals the results of the control process via an RS232C type interface to the main control device.

If a host system such as this were to be used in conjunction with an active oscillation isolation system and control systems for controlling a robot and other moving parts of an examination and/or processing machine, the host system would have to be able to control all of these individual systems in real time. This means that movements of the robot arm would only have to be signaled to the host system in real time, but the host system would also at the same time have to initiate measures to counteract the undesirable oscillations induced in the overall arrangement by the movements of the robot. Corresponding control signals for this purpose would have to be passed to the actuators for the active oscillation isolation system, once again in real time. However, host systems according to the prior art are not fast enough to do this.

The host systems which have been used until now therefore have the disadvantage that they are not fast enough, for example, to ensure that the effects of a movement of the robot arm on the carriage are adequately damped in real time.

SUMMARY OF THE INVENTION

The invention is based on the object of combining individual motion control systems to form an overall system for an examination and/or processing machine which has an active oscillation isolation system.

A further object of the invention is to match the individual motion control subsystems considerably more quickly than has been possible until now according to the prior art.

Yet another object of the invention is to reduce oscillations of the machine after movement processes more quickly than has been possible until now according to the prior art.

The invention is defined in claim 1.

The invention relates to an examination and/or processing device, for example a lithography appliance for use in the semiconductor industry. This appliance has a machine base, for example a heavy work table, on which an examination or processing unit is located. This unit may have an arm which has a microscope or an illumination unit. A moveable carriage is fitted on the lower part and supports the substrate to be examined or to be processed, for example a wafer. In order to examine or process the substrate, the carriage is moved with the substrate located on it to the desired working position, for example underneath the examination or processing unit. A robot with a robot arm is provided on the lower part of the examination or processing machine, in order to place the substrate on the carriage or to remove the substrate from the carriage.

The lower part of the machine together with all the fittings is mounted by means of oscillation isolators with respect to the ground, such that the oscillation level is low, in order to isolate the entire machine from seismic oscillations of the ground and other disturbances.

Undesirable oscillations such as these are also caused by movements of the carriage and of the robot arm. This is because the wafer is moved relative to the optical examination unit by means of the carriage, which is located on the oscillation-isolated base, before and after the optical examination. Mass-induced or other disturbance forces and disturbance oscillations occur during acceleration and deceleration of the carriage. Disturbances such as these are also caused by the movements of the robot arm when placing the wafer down, and removing it. Disturbances such as these are highly undesirable in the semiconductor industry, for example when wafers are intended to be examined by means of optical systems.

Separate control systems are in each case used in order to compensate for undesirable oscillations of the carriage and of the robot arm, with the object of causing the oscillations of the carriage and robot arm to decay as quickly as possible.

Movements of individual parts of the overall system are, however, also undesirably transmitted to the other machine parts. For example, during a movement of the robot arm, mass-induced forces and therefore disturbances are transmitted to the lower part of the machine and to the carriage. The movement of the robot arm also causes air-pressure fluctuations, which are transmitted to the carriage. Coordinated interaction of the individual components is impossible unless the individual control systems are connected to one another.

According to the invention, such interaction is achieved in that the previously separate control systems are made subordinate to an overall control device or motion control system. This motion control system comprises a single appliance which connects the control systems for the machine lower part, the carriage and the robot arm to one another via a data bus with a real-time capability, thus monitoring and coordinating them by means of a further control system.

All the control subsystems can receive the respective movement data from the other subsystems via the data bus. Analog compensation signals to compensate for undesirable oscillations can be passed to the actuators on the basis of this data.

For example, the control system for the carriage can receive information in digital form about the movement state of the robot arm, and can use this data as the basis for producing analog control signals for the actuators, and thus for exerting damping opposing forces on the carriage, as well.

Suitable compensation signals for the actuators of the oscillation isolation system lead to a reduction in the undesirable oscillations of the overall system.

By way of example, the magnitude and direction of the forces which occur as a result of the movements of the robot arm are frequently predictable, since the processes of placing the wafer down and removing it are standardized procedures. The form and timings of the disturbances that occur are therefore also predictable. In consequence, the opposing forces that are required, and the signals which are required to initiate these opposing forces, can be determined in advance. This can be done by means of mathematical methods, or experimentally, and results in transmission characteristics or transfer functions. The data determined in this way for initiation of opposing forces is stored in the memory of the overall control device, and is called up as required.

In one alternative embodiment of the invention, these transmission characteristics are stored in memories which are located in the individual control subsystems.

A distinction is drawn between the forces that occur on the basis of those which are predictable and quasi-continuous, and those which are of a more sudden nature. The first type occurs, for example, when the carriage is moved, and the second when the work piece is placed on the carriage.

In the case of forces of the first type, the signal which initiates the opposing force is produced by convolution of the input signal and the stored transfer function. In the case of forces of the second type, the sudden force is used as a trigger to call up an opposing force signal from a memory.

BRIEF DESCRIPTION OF THE DRAWINGS

One exemplary embodiment of the invention will be described with reference to the drawings, in which.

DETAILED DESCRIPTION

Figure 1:
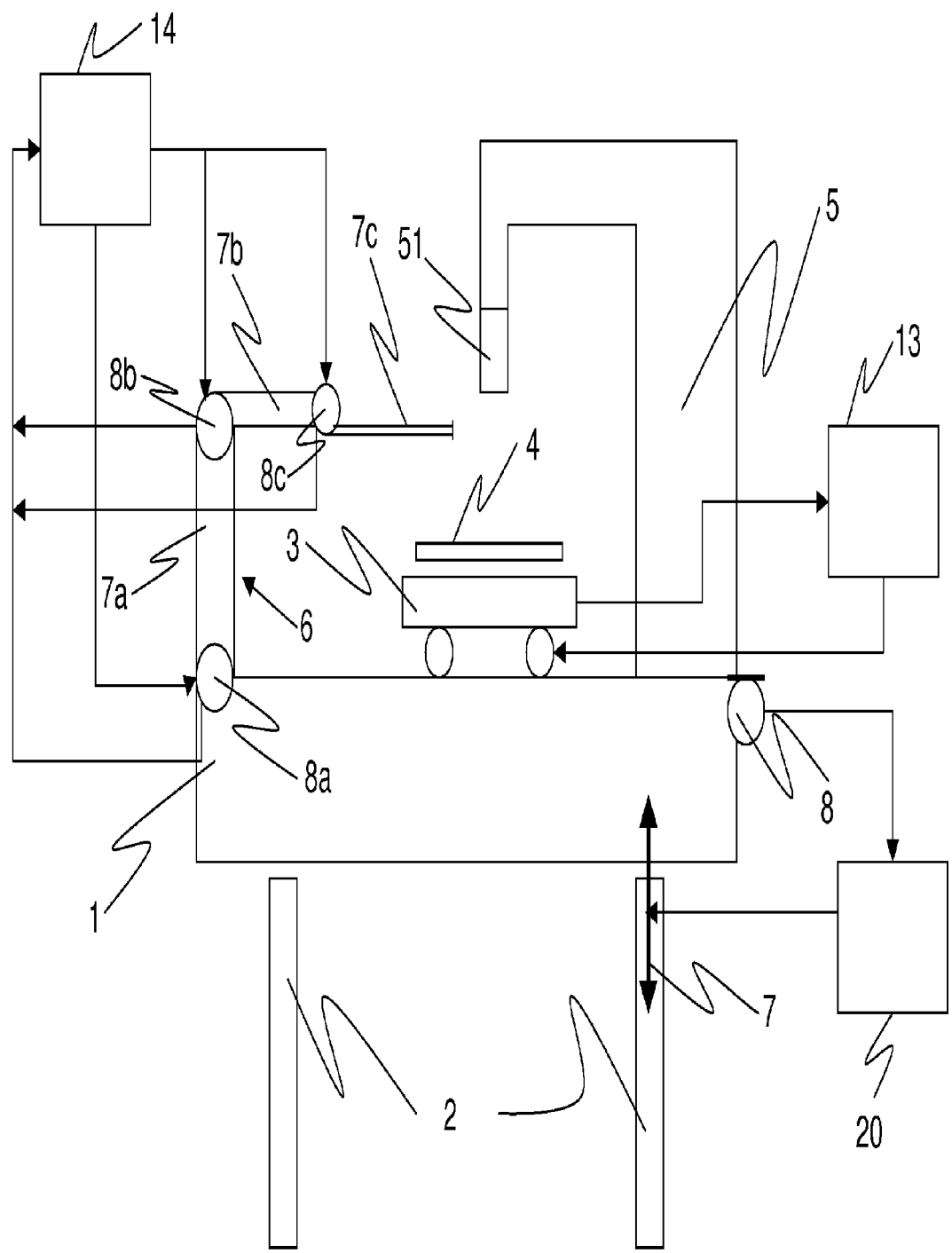
FIG. 1 shows a schematic illustration of an examination and processing machine with oscillation-isolated bearings and mutually separate motion control subsystems.

FIG. 1 shows a schematic illustration of an examination or processing machine, for example a lithography appliance, for illumination of wafers in the semiconductor industry. The base of this machine is a machine frame 1 which, for example, may have a heavy work plate. A carriage 3 is located on the machine frame 1, and is fitted with a work piece 4. By way of example, the work piece 4 may be a wafer. The position of the carriage 3 can be moved on the machine frame 1 in order to move the work piece 4 to different processing positions. The machine frame is also fitted on the one hand with an inspection apparatus 5 and on the other hand with a handling device 6.

The inspection apparatus 5 is used to examine the work piece 4. It may therefore comprise an optical system 51, for example a microscope. If the work piece 4 is a wafer, then the inspection apparatus 5 may also be a device for illumination of the wafer 4.

The handling device 6 is used for positioning the work piece 4 on the moveable carriage 3, and for removing the work piece 4 from it. This handling device 6 may comprise a robot with three arms 7a, 7b, 7c, which are connected to one another and to the machine frame 1 via three joints 8a, 8b, 8c, such that they can move.

The machine frame 1 is provided with oscillation isolation from the ground by means of a plurality of oscillation isolators 2 which, for example, may be in the form of an air-spring system. These oscillation isolators 2 isolate the entire arrangement mounted on them, from, for example, seismic and other oscillations of the ground.

Without further additional apparatuses, the oscillation isolators 2 represent a passive oscillation isolation system. Active oscillation systems are normally used for lithography appliances. This means that groups of actuators 7 and sensors 8 are added. The actuators 7 may be piezo-elements or electromagnetic motors. The sensors 8 may be position, speed or acceleration sensors.

In this case, one actuator 7 is provided between the oscillation isolator 2 and the machine frame 1 for each oscillation isolator 2 and allows the machine frame 1 to be moved vertically. The sensors 8 are fitted to the machine frame 1 and detect the vibration of the machine frame 1 together with the vibration of all the devices located on the frame 1. Just one actuator and one sensor are in each case shown, as being representative for these groups of actuators 7 and sensors 8.

A control device 13 is provided in order to control the carriage 3. When the aim is to move the carriage 3 with the work piece 4 located on it to a new working position, then the control device 13 sends appropriate analog control commands to the carriage 3. The carriage 3 then itself sends signals to the control device 13, describing the movement state of the carriage 3. These signals may include position, speed and/or acceleration values.

A control device 14 is provided in order to control the handling device 6. When the work piece 4 is intended to be placed on the carriage 3 or removed from the carriage 3, the control device 14 then sends appropriate analog control commands to the joints 8a, 8b, 8c and to the arms 7a, 7b, 7c of the handling device 6, in order to move them to the desired position. The joints 8a, 8b, 8c themselves send signals to the control device 14, describing the movement state of the handling device 6. These signals may be position, speed and/or acceleration values.

The control devices 20, 13 and 14 comprise regulators and therefore each represent one motion control subsystem.

In the configuration illustrated in FIG. 1, each of the subsystems comprising the machine frame 1, the carriage 3 and the handling device 6 is thus driven separately. Each of the control devices 20, 13, 14 has no knowledge of the respective other subsystems, that is to say the subsystems which are not associated with it itself. It is therefore also impossible to compensate for the effects of the movement of one of the subsystems on the others in order to allow undesirable oscillations caused by this movement to be damped.

To do this, the control devices 13 and 14 would have to have the capability to drive the actuators 7 of the oscillation isolation system directly.

Figure 2:
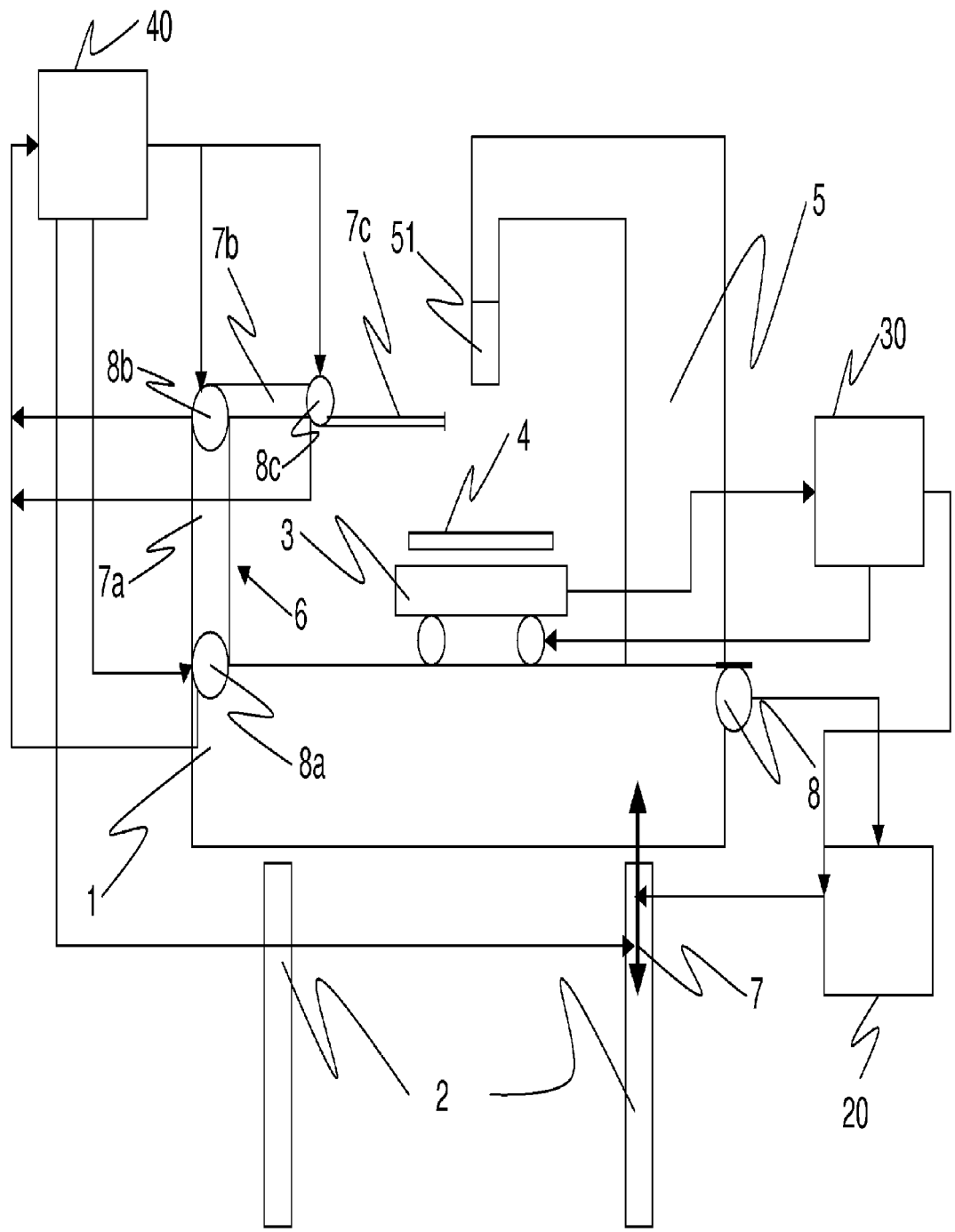
FIG. 2 shows a schematic illustration of an examination and processing machine with the actuators for an oscillation isolation system being driven by secondary control systems.

In FIG. 2, which is described in the following text, the control devices, which have so far been provided with the reference symbols 13 and 14, are referenced with the reference symbols 30 and 40, since their tasks are now greater than those shown in FIG. 1.

FIG. 2 shows the arrangement from FIG. 1 with connections added between the control devices 30 and 40 to the actuators 7 of the oscillation isolators. These connections are used for additionally driving the actuators 7 of the oscillation isolation system.

As described, the control device 30 produces the signals for the carriage 3 in order to control its movement, for example in order to move the work piece 4 to a new working position. In order to compensate for undesirable overall system vibration initiated from the carriage, the control device 30 sends control signals to the actuators 7 at the same time as the actuating signals that are sent to the carriage 3, in order to counteract the overall system vibration induced by the movements of the carriage 3. The control signals may act directly as analog actuating signals, or they may be indirect signals, which act via the control device 20. Since the undesirable effects of the movements of the carriage 3 on the overall system are anticipated in this way, the control device 30 acts as a feedforward system.

As described, the control device 40 receives signals from the three joints 8a, 8b, 8c of the handling device 6, describing the movement state of the handling device 6. In order to control the movements of the handling device 6, the control devices 40 send actuating signals to the arms 7a, 7b, 7c and to the joints 8a, 8b, 8c, respectively. This is done, for example, when the work piece 4 is intended to be placed on the carriage 3 or to be removed from the carriage 3. When undesirable oscillations of the handling device 6 occur, then these are detected from the received signals. The control device 40 sends analog actuating signals to the actuators 7 in order to produce appropriate opposing movements of the machine frame 1 which, overall, counteract the undesirable overall system oscillations produced by the carriage 3. Since the undesirable effects of the movements of the handling device 6 on the overall system are anticipated in this way, the control device 40 also represents a feedforward system.

Figure 3:
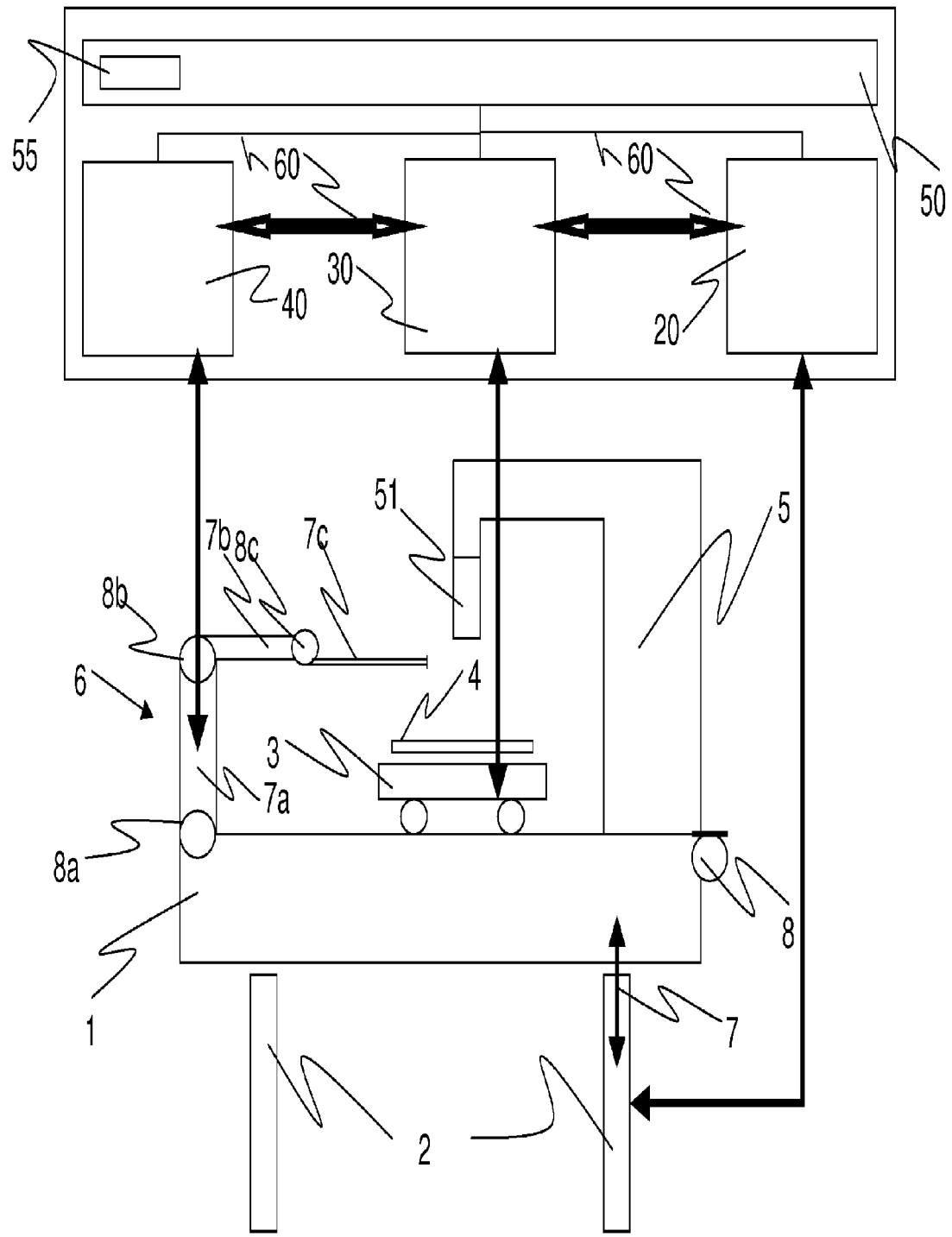
FIG. 3 shows a schematic illustration of an examination and processing machine with an overall control system.

FIG. 3 shows the arrangement from FIG. 2 with the control devices 20, 30, 40, illustrated schematically. These control devices 20, 30, 40 are once again connected to the oscillation isolators 2, to the carriage 3 and to the handling device 6. For clarity reasons, these connections are just each indicated by a double-headed arrow in FIG. 3, and not by two arrows in each case, as in FIG. 2.

The control devices 20, 30, 40 are now subordinate to an overall control device 50. The connections between the control devices 20, 30, 40 and to the overall control device 50 are provided by a bus device 60, which preferably operates digitally. The bus device 60 is used to interchange data between the control devices 20, 30, 40 and the overall control device 50. The movement states of all the appliance parts are known by the overall control device 50 by virtue of the bus device 60, so that it can coordinate the activities of the appliance parts. All the calculation and control processes can be prepared at the digital level; analog/digital conversions (and vice versa) are thus avoided, thus making the system sufficiently fast.

The overall control device 50 operates as a host system, that is to say its function is higher-level coordination.

For example, when the handling device 6 moves, then mass-induced forces occur and also act on the carriage 3 and the optical system 51. Furthermore, any movement of the positioning device 6 results in air-pressure fluctuations, which are likewise transmitted via the air to the carriage 3 and the optical system. Conversely, movements of the carriage 3 undesirably influence the positioning device 6.

The mutual influence between the carriage 3 and the handling device 6 will be described in the following text on the assumption that any movement of the positioning device 6 causes undesirable oscillations of the carriage 3.

The time profile of the vectorial sum of these forces, both of the mass-induced forces and those caused by air-pressure fluctuations, is detected, in advance on the basis of the magnitude and direction, by measuring the time profile of the magnitude of the force for each degree of freedom of the system. A representation of these values for the magnitude of the force in the form of a graph would result in a force trajectory.

These forces are detected as disturbance oscillations by sensors adjacent to the carriage 3 and adjacent to the handling device 6. The movements of the handling device 6 are repeated in the course of successive examinations or processing activities on the same work piece 4 or on a plurality of individual work pieces 4. These movements of the handling device 6 and of the work piece 4 together with the disturbance oscillations that occur can therefore be predicted in terms of their type and timings.

The overall control device 50 is able to store feedforward signals in a memory device 55, and to provide them for the control devices 20, 30, 40.

When it is intended to move the handling device 6 in the described manner, then the control device 20 reads the signals for the control device 30 in order to compensate for the oscillations caused by movements of the handling device 6, and then sends suitable actuating signals to the actuators 7.

Owing to the predictability of the disturbances that occur on the carriage 3, the control device 20 exerts suitable opposing forces on the actuators 7 of the oscillation isolators 2, taking account of the movement signals from the control device 30 so that, overall, this results in the overall system becoming steady more quickly, that is to say reaching the locked state or movement state before the occurrence of the mass-induced forces and the forces caused by air-pressure fluctuations.

The opposing forces are determined in advance. This can be done by two methods. The opposing forces are either determined by means of mathematical methods, or are measured experimentally in advance. Overall, this results in a transmission characteristic or transfer function. The values determined in this way for each degree of freedom of the system are stored in a memory 55 for the overall control device 50 as a series of values which represent the time profile of the magnitude of the force, and are called up as required.

In this case, a distinction can be drawn between inertial forces, which can be predicted and occur virtually continuously, and forces which are of a more sudden nature. The first type of forces occurs, for example, when the carriage 3 is moved in order to move the work piece 4 to a working position. The second type of forces occurs in particular when the work piece 4 is placed on the carriage 3.

In the case of the quasi-continuous forces, the opposing force signal is produced in the memory 55 by convolution of the input signal and the transfer function stored in the memory 55. When sudden forces occur, then these are used as a trigger to call up an opposing force signal from the memory 55.

This results in anticipation of the undesirable movements of the appliance parts caused by the desired movements of other appliance parts.

The described compensation mechanism can be provided for any "combination" of appliance parts; for example, movements of the handling device 6 are transmitted not only to the carriage 3 but also to the machine frame 1. In the end, the control device 20 passes suitable actuating signals to the actuators 7 in each of these cases.

The invention claimed is:

1. An examination and processing machine for lithography applications comprising:
    a machine frame;
    an inspection apparatus for examining a work piece wherein the work piece is a wafer;
    a carriage that is mounted on the machine frame, wherein the carriage can hold the work piece;
    a handling device for positioning the work piece on the carriage and for removing the work piece from the carriage;
    a series of oscillation isolators for low-oscillation mounting of the machine frame; and
    individual control devices, wherein the individual control devices comprise:
        (i) a first control device for influencing the oscillation isolators,
        (ii) a second control device for controlling the carriage, and
        (iii) a third control device for controlling the handling device; and
    an overall control system for controlling the individual control devices;
    wherein the individual control devices are individual motion control subsystems for the overall control system;
    wherein the individual control devices are connected to one another and to the overall control system in real time via a bus device in order to match an operation of the carriage, the handling device, and the oscillating isolators to one another for vibration isolation; and
    wherein, at a same time that a process which produces oscillations is started by the second control device or the third control device, a feedforward signal is produced by the overall control system for the first control device in order to influence an actuator to counteract, by anticipation, oscillations on the machine frame.

2. The examination and processing machine as claimed in claim 1, wherein, when one of the individual control devices detects excessive oscillations, the starting of further processes that produce oscillations is delayed.

3. The examination and processing machine as claimed in claim 1, wherein the second control device and the third control device have an indirect connection, via the first control device, to the actuator, or a direct connection to the actuator.

4. The examination and processing machine as claimed in claim 1, wherein the feedforward signal represents a convolution of a movement signal and a transfer function.

5. The examination and processing machine as claimed in claim 1, wherein the bus device is a digital bus system.

6. An examination and processing machine comprising:
    a machine frame;
    an inspection apparatus for examining a work piece;
    a carriage that is mounted on the machine frame, wherein the carriage can hold the work piece;
    a handling device for positioning the work piece on the carriage and for removing the work piece from the carriage;
    an oscillation isolator for low-oscillation mounting of the machine frame; and
    a control system that comprises:
        (i) a first control device for influencing the oscillation isolator,
        (ii) a second control device for controlling the carriage, and
        (iii) a third control device for controlling the handling device,
    wherein the second control device transmits, at the same time, a first signal to the carriage and a second signal to an actuator that is arranged between the machine frame and the oscillation isolator;
    wherein the first signal is to control the movement of the carriage and the second signal is to counteract vibration induced by the movement of the carriage; and
    wherein, at a same time that a process which produces oscillations is started by the second control device or the third control device, a feedforward signal is produced by the control system for the first control device in order to influence actuators to counteract, by anticipation, oscillations on the machine frame.

7. The examination and processing machine as claimed in claim 6, wherein the second control device indirectly transmits the second signal to the actuator via the first control device.

8. The examination and processing machine as claimed in claim 6, wherein the third control device transmits a third signal to the handling device for positioning the work piece on the carriage and for removing the work piece from the carriage; and
    wherein the third control device receives a fourth signal from a joint of the handling device that describes a movement state of the handling device.

9. The examination and processing machine as claimed in claim 8, wherein the third control device detects oscillation of the handling device based on the fourth signal received from joint; and
    wherein the third control device transmits a fifth signal to the actuator to produce opposing movements of the machine frame in order to counteract the oscillation of the carriage.

\* \* \* \* \*